United States Patent [19]
Buck et al.

[11] Patent Number: 5,442,316
[45] Date of Patent: Aug. 15, 1995

[54] TEMPERATURE COMPENSATED AND SUPPLY INDEPENDENT CLIPPING DISTORTION INDICATOR

[75] Inventors: Paul E. Buck, Russiaville; Mark W. Gose, Kokomo; Ian D. Jay, Logansport, all of Ind.

[73] Assignee: Delco Electronics Corporation, Kokomo, Ind.

[21] Appl. No.: 268,750

[22] Filed: Jun. 30, 1994

[51] Int. Cl.6 .......................... H03F 1/26; H03F 1/30
[52] U.S. Cl. ....................... 330/2; 330/149; 330/289
[58] Field of Search ............... 330/2, 9, 149, 289; 381/120, 121

[56] References Cited
U.S. PATENT DOCUMENTS

| | | | |
|---|---|---|---|
| 3,891,933 | 6/1975 | Suzuki et al. | 330/2 |
| 4,048,573 | 9/1977 | Evans et al. | 330/2 |
| 4,318,053 | 3/1982 | Sondermeyer | 330/2 X |
| 5,068,620 | 1/1994 | Botti et al. | 330/2 |

*Primary Examiner*—Steven Mottola
*Attorney, Agent, or Firm*—Jimmy L. Funke

[57] ABSTRACT

A circuit and method are provided for generating a clipping distortion detector output signal for an integrated circuit audio amplifier which is independent of operating temperature and supply voltage. The system includes an audio amplifier having a voltage gain, a first input for receiving input voltage and an output for generating an amplified output voltage. A supply voltage is supplied to the audio amplifier and the supply voltage determines the maximum amplified output voltage. A comparison voltage is generated which is indicative of the output voltage divided by the voltage gain. A clip detector voltage comparator receives the input voltage and the comparison voltage and provides a clipping distortion detect signal when the input voltage deviates from the comparison voltage in excess of an offset voltage which is indicative of detection of excessive clipping distortion. The output voltage is adaptively controlled as a function of the supply voltage so as to maintain a substantially constant maximum percent distortion. In addition, the offset voltage is also controlled as a function of temperature to provide temperature compensation. The supply voltage and temperature compensation may be achieved by generating a current source as a function of supply voltage and temperature.

9 Claims, 2 Drawing Sheets

TEMPERATURE COMPENSATED AND SUPPLY INDEPENDENT CLIPPING DISTORTION INDICATOR

TECHNICAL FIELD

This invention relates generally to audio amplifiers and, more particularly, to a circuit and method for generating a clipping distortion detect output signal for an integrated circuit audio amplifier which is independent of operating temperature and/or supply voltage.

Discussion

It is generally common for audio amplifiers to produce audio outputs which can become distorted due to clipping. Clipping is a well known phenomenon which often occurs where the audio amplifier output exceeds the amplifier's dynamic range. As a consequence, the output is no longer able to follow the dynamics of the input in a linear manner, and the output signal is clipped. This causes the expected amplifier peak-to-peak voltage output to be reduced, thereby resulting in an amount of distortion. To handle the distortion problem, a number of currently existing audio amplifiers generate a clipping distortion detect signal which indicates that the audio outputs are becoming distorted due to clipping. With the clipping distortion detect signal, audio amplifier systems are usually capable of responding to the detect signal to control system operations so as to bring the amplifier output to within an acceptable amount of distortion.

In the past, conventional integrated circuit audio amplifiers have employed clipping distortion detect schemes which include a comparator circuit that compares the amplifier input signal to the amplifier output signal divided by the gain of the amplifier. When the absolute value of the input signal is greater than the absolute value of the output signal divided by the voltage gain, plus some fixed amount of offset, the comparator fires. The comparator thereby generates a clipping distortion detect output signal which indicates that the amplifier output signal is distorted. With this approach, the fixed amount of offset is directly related to the level of distortion that is required to fire the comparator.

Audio amplifier feedback systems which utilize the above conventional clipping distortion indicator circuit generally set the maximum level of distortion that will be heard by a listener. When this amount of distortion is exceeded, the clipping distortion detect output signal is generally used to cause the audio amplifier system to adapt to the excessive distortion. This usually involves triggering a reduction in the amplifier input or an increase in the amplifier supply voltage in order to reduce the amount of distortion so as to bring the distortion to within an acceptable amount.

As previously mentioned, the output dynamic range of the amplifier is typically dependent on amplifier supply voltage. In a number of systems, the supply voltage can vary, especially for automotive applications where a normal radio operating range may vary between 9 and 18 Volts, for example. Since the amount of clipping distortion is dependent on the available output voltage swing, the amount of clipping will fluctuate with changes in the supply voltage. One approach for an output sensing circuit is described in U.S. Pat. No. 5,068,620, issued to Botti et al, which generates a signal indicative of output distortion that is independent of power supply voltage. The aforementioned prior art circuit employs a pair of comparators for comparing a reference voltage with the audio amplifier output divided by the gain. To achieve supply independence, the Botti et al approach obtains the reference voltage as a divided portion of the input voltage.

In addition, conventional clipping distortion indicator outputs have been found to be dependent upon operating temperature. Generally, supply voltage and temperature dependencies have been observed as a change in the amount of audio signal clipping that is required to activate the clipping distortion indicator as the operating temperature or supply voltage is varied. This is typically measured in percent of waveform clipped or percent total harmonic distortion (THD). Most currently existing audio amplifier systems tend to achieve a percent total harmonic distortion that varies with the supply voltage and temperature. Conventional systems generally do not provide for adjustable compensation due to the effects caused by the operating temperature and/or supply voltage and are therefore unable to achieve an optimal constant maximum distortion level.

It is therefore one object of the present invention to provide for a circuit and method of generating a distortion detect output signal for an integrated circuit audio amplifier.

It is another object of the present invention to provide for a circuit and method of generating the distortion detect output signal for an audio amplifier that can be independent of the amplifier supply voltage.

It is a further object of the present invention to provide for such a circuit and method for generating the distortion detect output signal for an audio amplifier system that can be independent of the supply voltage and/or operating temperature, and that may be employed to achieve a constant maximum distortion level.

SUMMARY OF THE INVENTION

In accordance with the teachings of the present invention, a system and method are provided for generating a clipping distortion detect output signal for an integrated circuit audio amplifier. The circuit includes an audio amplifier which has a voltage gain, a first input for receiving an input voltage, and an output for generating an amplified output voltage. A supply voltage is supplied to the audio amplifier and determines a maximum amplifier output voltage. A comparison voltage is generated as the output voltage divided by the voltage gain. A clip detector voltage window comparator compares the input voltage with the comparison voltage. The window comparator further has an adaptive voltage offset and produces a clipping distortion detect output signal when the input voltage deviates from the comparison voltage in excess of the voltage offset so as to indicate excessive clipping distortion. The adaptive voltage offset is adjusted as a function of the amplifier supply voltage so as to maintain substantially constant maximum percent distortion. In addition, the adaptive voltage offset may be adjusted as a function of temperature so as to compensate for temperature effects.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENT

Figure 1:
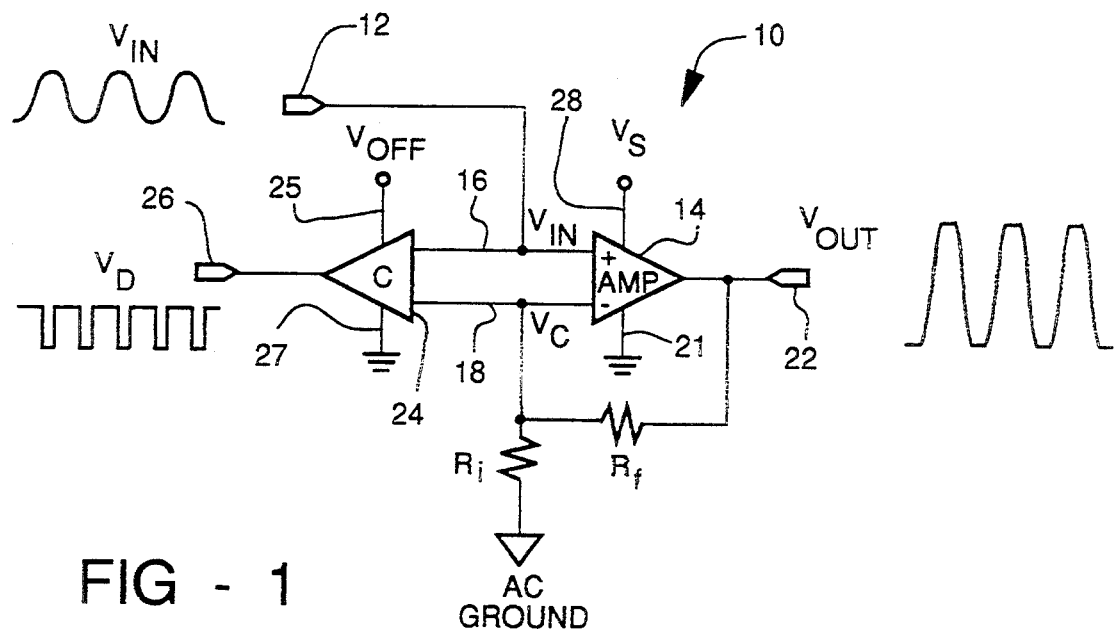
FIG. 1 is a block diagram which illustrates an audio amplifier system that may be employed in the present invention.

Turning now to FIG. 1, an audio amplifier system 10 is shown which generates a clipping distortion detect output signal $V_D$ according to the present invention. The audio amplifier system 10 includes an audio amplifier 14 of the type that is commonly employed in audio sound systems and is particularly suited for use in automotive radios and other sound systems for providing amplification. The audio amplifier 14 has a non-inverting or positive input (+) connected to an input terminal 12 for receiving an input voltage $V_{IN}$. The audio amplifier 14 also has an inverting or negative input (−) and an output 22 which is coupled to the negative input via a pair of gain setting resistors $R_i$ and $R_f$. More specifically, gain setting resistor $R_f$ is connected between the amplifier output 22 and negative input of amplifier 14, while resistor $R_i$ is coupled between the negative input of amplifier 14 and an AC ground.

Audio amplifier 14 has a supply line 28 for receiving a supply voltage $V_s$. A grounded line 21 is also coupled to audio amplifier 14. In accordance with the above configured audio amplifier 14, the voltage potential across lines 20 and 21 determines the dynamic output range of amplifier 14. Accordingly, the amplifier output dynamic range extends essentially from zero to the supply voltage $V_s$. Whenever an expected amplifier output voltage exceeds the dynamic output range, the amplifier output will be clipped and thereby leave a maximum peak-to-peak voltage output equal to about the amplifier dynamic output range. The circuit provided in system 10 is preferably fabricated as an integrated circuit (IC) with a supply voltage input. It should be appreciated that a variety of amplifiers may be employed which utilize a supply voltage that can affect the amplifier's dynamic output range.

The audio amplifier system 10 further includes a clipping distortion detect voltage comparator 24 for detecting clipping distortion in excess of an acceptable amount. Voltage comparator 24 has a non-inverting or positive input (+) connected to the input terminal 12 for receiving input voltage $V_{IN}$. Comparator 24 also has an inverting or negative input (−) coupled to the negative input of audio amplifier 14. Comparator 24 compares the input voltage $V_{IN}$ with a comparison voltage $V_c$. Comparison voltage $V_c$ is derived from the amplifier output voltage $V_{OUT}$ divided by the amplifier's voltage gain. Under normal operating conditions when the expected amplifier output does not exceed the dynamic output range, the amplifier input signal $V_{IN}$ and the comparison voltage $V_c$ are substantially equal, since signal clipping is not occurring. However, when the expected output voltage reaches and then exceeds the dynamic range of the audio amplifier 14, amplifier 14 will begin to clip the output voltage $V_{out}$. This also directly results in a proportional reduction of the comparison voltage $V_c$.

The clipping distortion detect voltage comparator 24 according to the present invention has a supply line 25 for receiving a controllable offset voltage $V_{off}$. In effect, offset voltage $V_{off}$ provides a controllable voltage offset window. The voltage offset window allows the comparator 24 to compare the two inputs thereto and generate a negative pulse whenever the difference between the positive and negative inputs exceeds the offset voltage $V_{off}$ of the window. This occurrence of a negative pulse is indicative of excessive clipping beyond a predetermined acceptable amount.

The voltage comparator 24 produces a digital distortion detect output signal $V_D$ which in turn is supplied to an output terminal 26. The digital output signal $V_D$ is shown as a digital pulse train that includes repeated negative pulses, each of which are representative of excessive clipping distortion detection. The clipping distortion detect output signal $V_D$ generated according to the present invention may advantageously be employed to adjust the audio amplifier system 10 so as to correct for distortion effects independent of temperature and supply voltage. According to one approach, the dynamic output range of audio amplifier 14 may be increased by increasing the supply voltage $V_s$. According to another approach, the input voltage $V_{IN}$ may be reduced so as to reduce the expected amplifier output.

As previously mentioned, the level of clipping needed to develop excessive clipping is dependent on the dynamic output range of the amplifier 14 which in turn is dependent on supply voltage $V_s$. For example, a 14 volt peak-to-peak sine wave with 1.0 volt of symmetrical clipping has less distortion than a 10 volt sine wave which also has 1.0 volt of symmetrical clipping. In order to assure a constant maximum distortion level according to the preferred embodiment, the present invention takes into account the effects of a change in the supply voltage $V_s$ and compensates for such a change.

Figure 2:
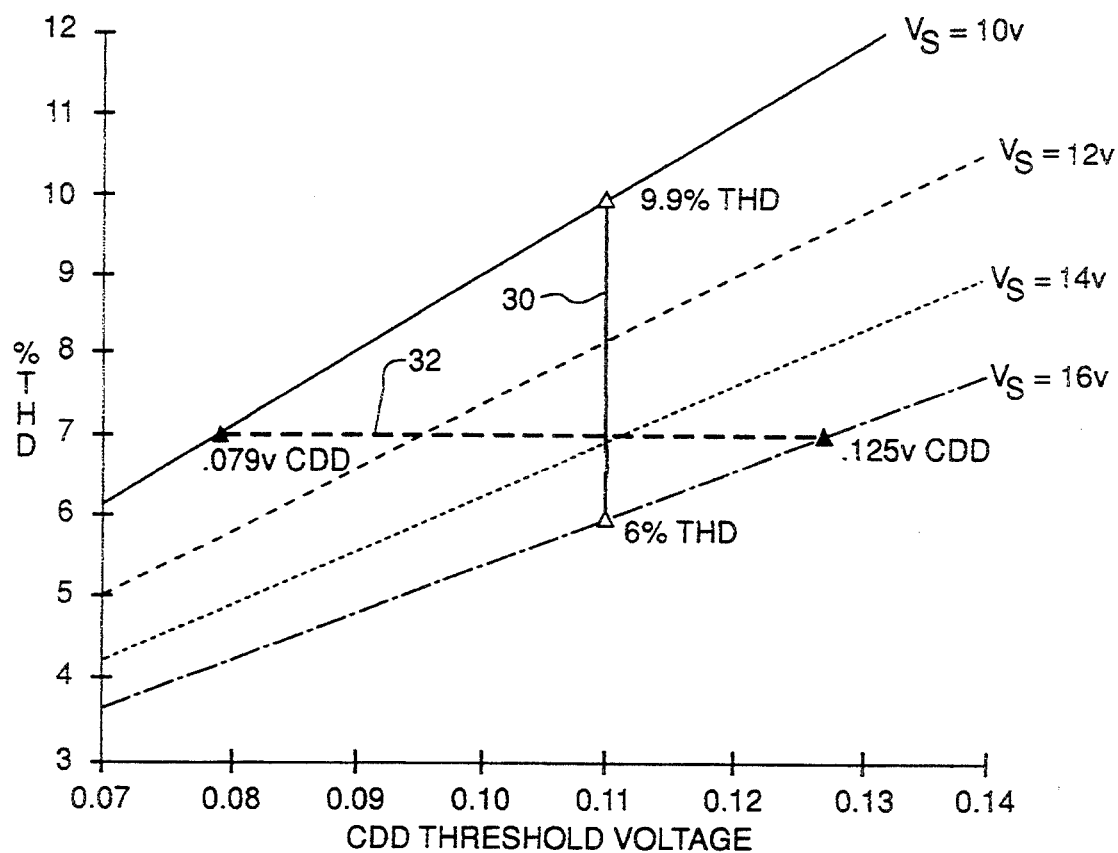
FIG. 2 is a chart which illustrates supply voltage dependency plotted as percent distortion versus comparator threshold voltage for one example.

Referring now to FIG. 2, the relationship of the percent total harmonic distortion (THD) versus comparator threshold voltage is shown for a supply voltage $V_s$ varied between 10 volts and 16 volts according to an illustrative example. As shown, given a fixed comparator threshold voltage of 0.11 volts, a change in the supply voltage from 16 volts to 10 volts causes the percent total harmonic distortion to increase from 6.0 percent to 9.9 percent as shown by line 30. However, according to the preferred embodiment it is particularly desirable to maintain a maximum percent total harmonic distortion at a constant level. To accomplish this, the present invention employs an adaptively controllable voltage offset $V_{off}$ in conjunction with voltage comparator 24. The voltage offset $V_{off}$ varies as a function of the supply voltage $V_s$ to provide a substantially fixed percent total harmonic distortion. For example, line 32 in FIG. 2 illustrates how the voltage offset $V_{off}$ may be varied from 0.125 volts to 0.079 volts in order to maintain a constant seven percent (7%) total harmonic distortion over a changing supply voltage $V_s$ from 16 volts to 10 volts. This enables the audio amplifier system 10 to achieve a substantially constant maximum distortion level.

Figure 3:
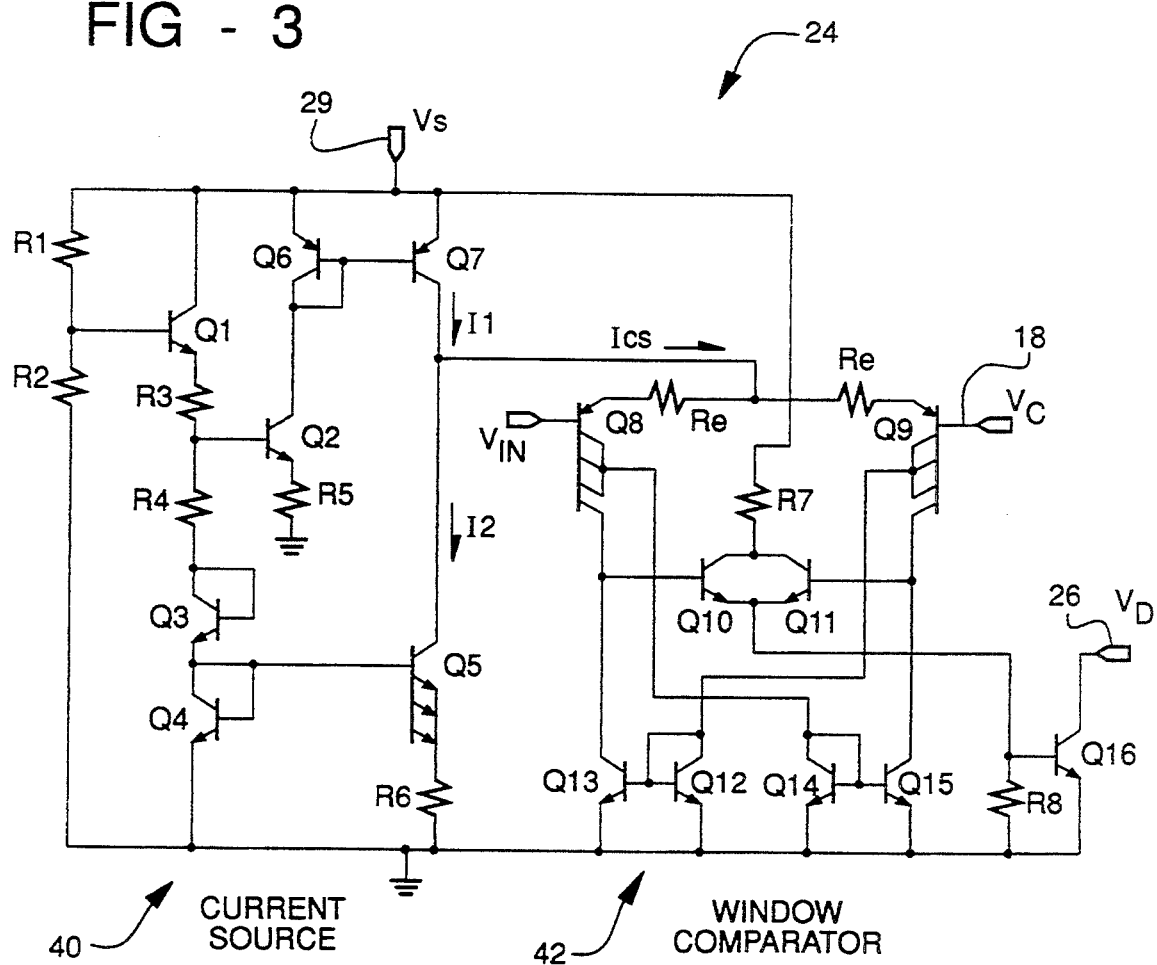
FIG. 3 is a circuit diagram of a clipping distortion detect comparator with offset voltage compensation in accordance with the present invention.

To achieve the aforementioned compensation of supply voltage $V_s$ and temperature T, the present invention preferably employs a voltage comparator 24 which generates a current source $I_{cs}$ as a function of the supply voltage $V_s$ and temperature T. With particular reference to FIG. 3, one embodiment of such a voltage comparator 24 is shown therein. Voltage comparator 24 has a supply terminal 29 for receiving the supply voltage $V_s$. The comparator 24 includes a current source network 40 made up of resistors R1 through R6 and transistors Q1 through Q7 interconnected between the supply terminal 29 and ground. The comparator 24 also includes a window comparator network 42 connected to network 40. The current source network 40 generates and supplies the current source $I_{cs}$ to the window comparator network 42. Current source $I_{cs}$ is derived from subtracting current 12 from current $I_1$. Currents $I_1$ and $I_2$ may be represented by the following two equations, respectively:

$$I_1 = \frac{K_o V_s}{R_x} + \frac{K_1 V_{be}}{R_y}$$

$$I_2 = \frac{V_t}{R_z} \ln(K_2)$$

Accordingly, current source $I_{cs}$ may be represented by the following equation:

$$I_{cs} = \frac{K_o V_s}{R_x} + \frac{K_1 V_{be}}{R_y} - \frac{V_t}{R_z} \ln(K_2)$$

Where $K_0$ is a constant representative of a voltage divider equal to one-half resistor $R_4$ divided by the sum of resistor $R_4$ and $R_3$. $R_x$ is equal to resistor $R_5$, $K_1$ is a constant which represents the quantity of resistor $R_3$ minus two times $R_4$ divided by the summation of $R_3$ and $R_4$. $R_y$ is set equal to resistor $R_5$. $V_{be}$ is a given constant which varies with the temperature T at a rate of approximately two millivolts decrease per one degree celsius increase.

The window comparator network 42 is made up of a pair of equal value resistors $R_e$ coupled between inputs 16 and 18. The window comparator network 42 further includes resistors $R_7$ and $R_8$ and transistors Q8 through Q16. Transistors Q8 and Q9 each have four collectors with three of the collectors tied together to provide the desired PNP ratioing. According to the circuit configuration shown in the window comparator network 42, the voltage offset $V_{off}$ is represented by the following equation:

$$V_{off} = V_t \ln(3) + I_{cs} \frac{R_e}{2}$$

By substituting current source $I_{cs}$ into the equation for voltage offset $V_{off}$, the voltage offset $V_{off}$ may be represented by the resulting equation as follows:

$$V_{off} = V_t K_3 + V_s K_4 + V_{be} K_5$$

Where $K_3$, $K_4$ and $K_5$ are constants which may be chosen so that the offset voltage $V_{off}$ can be set for the appropriate supply dependence and temperature dependence so as to achieve a constant maximum level of clipping distortion for the audio amplifier system 10. The first quantity of $V_t$ multiplied by $K_3$ has a positive temperature coefficient. The second quantity of $K_4$ multiplied by $V_s$ is a function of supply voltage. The third quantity of $K_5$ multiplied by $V_{be}$ has a voltage. The third quantity of $K_5$ multiplied by $V_{be}$ has a negative temperature coefficient. Accordingly, by judiciously choosing values for constants $K_3$, $K_4$ and $K_5$, the offset voltage $V_{off}$ can be set to the appropriate supply dependence and temperature dependence so as to provide a constant maximum level of clipping distortion in the audio amplifier system 10.

Figure 4A:
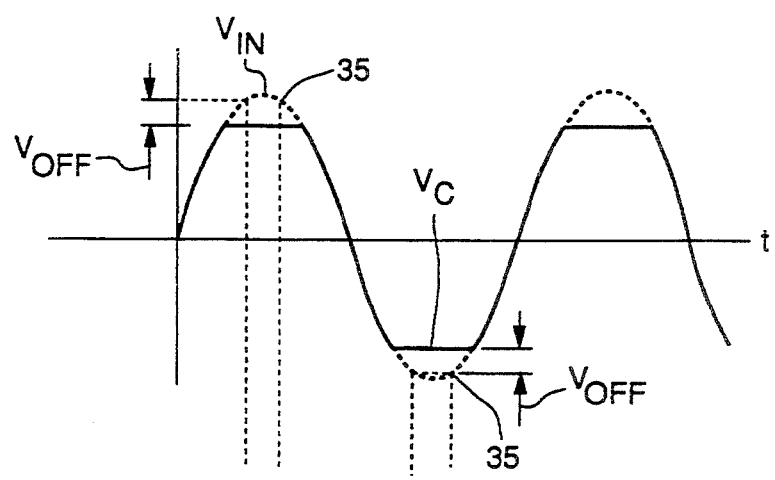
FIGS. 4A and 4B show voltage waveforms obtained from the audio amplifier system in accordance with one example of the present invention.
Figure 4B:
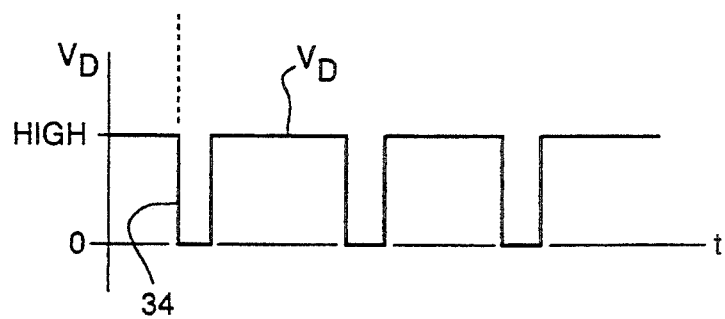

The operation of the audio amplifier system 10 will now be described in connection with the voltage waveforms shown in FIGS. 4A and 4B. During normal operations when the expected amplifier output does not exceed the dynamic output range of audio amplifier 14, the comparison voltage $V_c$ on line 18 will mimic the input voltage $V_{IN}$ on line 16. Under such conditions, the comparator 24 will produce a "high" impedance output. This correlates to a "high" voltage output. As the expected amplifier output exceeds the dynamic output range of audio amplifier 14, the amplifier 14 is overdriven and clipping begins to occur. The comparison voltage $V_c$ on line 18 likewise begins to deviate from the input voltage $V_{IN}$ on line 16 as shown in FIG. 4A. As long as the comparison voltage $V_c$ does not exceed the input voltage $V_{IN}$ by the amount of voltage offset $V_{off}$, the comparator clipping distortion detect output $V_D$ will remain at "high" impedance.

During operation when the amount of clipping exceeds an acceptable level as determined by adaptive voltage offset $V_{off}$, the comparator 24 will activate and generate a negative pulse indicative of excessive clipping distortion detection. Referring to FIG. 4B, the negative pulse 34 occurs when the voltage potential between input voltage $V_{IN}$ and comparison voltage $V_c$ exceeds the voltage offset $V_{off}$. In accordance with the present invention, the voltage offset $V_{off}$ will adapt to changes in the supply voltage $V_s$ and temperature T in a manner which allows for the realization of a constant percent total harmonic distortion detection level so that a constant maximum level of clipping distortion is realized.

The distortion detect output voltage $V_D$ may then be employed by a given audio amplifier system 10 to produce a control voltage which in turn may be used to readjust the audio amplifier system 10 to bring the distortion to within an acceptable amount. This may be accomplished by reducing the amount of input voltage $V_{IN}$ or increasing the supply voltage $V_s$. In any event, the distortion detect output signal $V_D$ will continually produce negative pulses 34 as long as the amount of clipping distortion exceeds the selected percent of harmonic distortion level.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

We claim:

1. An audio amplifier system for generating a clipping distortion detection signal which identifies the occurrence of excessive clipping distortion, said system comprising:

an audio amplifier having a voltage gain, a first input for receiving an input voltage, and an output for generating an amplified output voltage;

a supply voltage supplied to said audio amplifier, said supply voltage determining a maximum amplifier output voltage;

means for generating a comparison voltage which is indicative of the output voltage divided by the voltage gain;

a clip detector voltage comparator having a first input for receiving the input voltage, a second input for receiving the comparison voltage, a voltage offset and a comparator output for providing a clipping distortion detection signal when the input voltage deviates from the comparison voltage in excess of the offset voltage so as to indicate the detection of excessive clipping distortion; and compensation means for adjusting the voltage offset as a function of the supply voltage so as to maintain a substantially constant maximum percent distortion.

2. The amplifier system as defined in claim 1 wherein said compensation means further comprises temperature compensation means for adjusting the voltage offset as a function of temperature.

3. The amplifier system as defined in claim 1 wherein said compensation means comprises a window comparator circuit which receives a control current that is a function of the supply voltage.

4. The amplifier system as defined in claim 3 wherein said window comparator circuit is included with said comparator.

5. An audio amplifier system for generating a clipping distortion detection signal that identifies the occurrence of excessive clipping distortion over a substantially constant maximum percent distortion, said system comprising:

an audio amplifier having an input for receiving an input voltage, a voltage gain, and an output for providing an amplifier output voltage;

a supply voltage supplied to said audio amplifier, said supply voltage determining a maximum amplifier output voltage limit;

means for generating a comparison voltage which is indicative of the amplifier output voltage divided by the voltage gain;

a clip detector comparator having a first input for receiving the input voltage and a second input for receiving the comparison voltage;

a controllable voltage offset window associated with said comparator; and a current control circuit for generating a control signal to control the voltage offset window as a function of the supply voltage so as to maintain a substantially constant maximum distortion level.

6. The system as defined in claim 5 wherein said current control circuit further generates the control signal as a function of temperature.

7. A method of producing a clipping distortion detect signal which identifies the occurrence of excessive clipping distortion over a substantially constant maximum percent distortion level, said method comprising:

supplying a voltage signal to an audio amplifier, said voltage signal determining a maximum amplifier output voltage;

applying an input signal to the audio amplifier to generate an amplified output signal as a function of amplifier voltage gain;

generating a comparison voltage which is indicative of the output voltage divided by the amplifier voltage gain;

comparing the input voltage with the comparison voltage and providing a clipping distortion detect output signal when the input voltage deviates from the comparison voltage in excess of an offset voltage which is indicative of excessive clipping distortion; and adaptively selecting the offset voltage as a function of the supply voltage so as to maintain a substantially constant maximum percent distortion.

8. The method as defined in claim 7 further comprising the step of adaptively adjusting the voltage offset as a function of temperature so as to maintain a substantially constant maximum percent distortion level.

9. The method as defined in claim 7 wherein the step of adaptively selecting the offset voltage as a function of the supply voltage comprises generating a control circuit for controlling a voltage offset window.

* * * * *